United States Patent
Wade et al.

(10) Patent No.: US 9,869,598 B1
(45) Date of Patent: Jan. 16, 2018

(54) LOW COST SMALL FORCE SENSOR

(71) Applicant: Honeywell International Inc., Morris Plains, NJ (US)

(72) Inventors: Richard Wade, Worthington, OH (US); Alistair David Bradley, Hilliard, OH (US)

(73) Assignee: Honeywell International Inc., Morris Plains, NJ (US)

( * ) Notice: Subject to any disclaimer, the term of this patent is extended or adjusted under 35 U.S.C. 154(b) by 0 days.

(21) Appl. No.: 15/192,311

(22) Filed: Jun. 24, 2016

(51) Int. Cl.
*G01L 9/00* (2006.01)
*B81B 3/00* (2006.01)
*B81C 1/00* (2006.01)

(52) U.S. Cl.
CPC .......... *G01L 9/0055* (2013.01); *B81B 3/0021* (2013.01); *B81C 1/00269* (2013.01); *B81B 2201/0292* (2013.01); *B81B 2203/0127* (2013.01); *B81B 2203/0315* (2013.01); *B81C 2201/013* (2013.01); *B81C 2203/0109* (2013.01)

(58) Field of Classification Search
CPC .......... G01L 9/0055; B81B 3/0021; B81B 2203/0127; B81B 2203/0315; B81B 2203/0109; B81B 2201/0292; B81C 1/00269; B81C 2201/013; B81C 2203/0109
See application file for complete search history.

(56) References Cited

U.S. PATENT DOCUMENTS

| | | | | |
|---|---|---|---|---|
| 5,291,788 A | * | 3/1994 | Oohata | G01L 9/0054 338/4 |
| 5,600,074 A | | 2/1997 | Marek et al. | |
| 7,216,547 B1 | * | 5/2007 | Stewart | G01L 9/0055 257/415 |
| 8,806,964 B2 | | 8/2014 | Thanigachalam et al. | |
| 2007/0251328 A1 | * | 11/2007 | Selvan | G01L 1/18 73/777 |
| 2010/0065956 A1 | | 3/2010 | Wang et al. | |
| 2010/0077863 A1 | * | 4/2010 | Miyoshi | G01L 9/0016 73/727 |
| 2012/0018821 A1 | | 1/2012 | Beyeler | |
| 2012/0075030 A1 | * | 3/2012 | Iwasaki | H03H 9/1057 331/156 |
| 2013/0247689 A1 | * | 9/2013 | Thanigachalam | G01L 9/0054 73/862.627 |

FOREIGN PATENT DOCUMENTS

| | | |
|---|---|---|
| DE | 102008037572 A1 | 8/2009 |
| EP | 1519173 A1 | 3/2005 |
| EP | 2270455 A2 | 1/2011 |
| WO | 2015065639 A1 | 5/2015 |

OTHER PUBLICATIONS

Europe Patent Application No. 17176511.8, Extended European Search Report, dated Nov. 17, 2017, 9 pages.

* cited by examiner

*Primary Examiner* — Yosef Gebreyesus
(74) *Attorney, Agent, or Firm* — Conley Rose, P.C.

(57) ABSTRACT

Disclosed herein are force sensors which include a sense die assembly and methods for manufacturing the sense die assembly and the force sensor. The disclosed sense die assembly, force sensor, and methods utilize wafer-level retention to hold an actuation element in a cavity of the sense die.

16 Claims, 1 Drawing Sheet

LOW COST SMALL FORCE SENSOR

CROSS-REFERENCE TO RELATED APPLICATIONS

None.

STATEMENT REGARDING FEDERALLY SPONSORED RESEARCH OR DEVELOPMENT

Not applicable.

REFERENCE TO A MICROFICHE APPENDIX

Not applicable.

BACKGROUND

Industrial and commercial applications are increasingly utilizing sensors to determine a force, for example, in the field of consumer electronics. Customers in certain applications need small sensors, and finding a sensor design that can easily and cost-effectively integrate into an application and that is small enough to fit into any footprint, for example, on a scale required by consumer electronics, has been a challenge.

SUMMARY

Disclosed herein is a low cost small force sensor which includes a sense die assembly, and techniques for manufacturing the sense die assembly and the force sensor, as well as techniques for operation of the force sensor.

Aspects of the disclosure include a sense die assembly which can include a sense die having a top side and a bottom side, wherein the sense die includes a cavity and a diaphragm formed therein by etching, and one or more sensing elements positioned on a bottom side of the diaphragm; an actuation element placed in the cavity of the sense die and in contact with a top side of the diaphragm and with a wall of the cavity; and a cover member positioned on the top side of the sense die, wherein the cover member includes an opening positioned over the cavity of the sense die, wherein a portion of the actuation element extends through the opening, wherein the cover member provides wafer-level retention of the actuation element in the cavity.

Aspects of the disclosure also include a force sensor which can include a substrate; a sense die having a top side and a bottom side, wherein the sense die includes a cavity formed therein and a diaphragm, and one or more sensing elements positioned on a bottom side of the diaphragm, wherein the bottom side of the sense die is flip chip bonded to the substrate; an actuation element placed in the cavity of the sense die and in contact with a top side of the diaphragm and with a wall of the cavity; and a cover member positioned on the top side of the sense die, wherein the cover member includes an opening positioned over the cavity of the sense die, wherein the actuation element extends through the opening, wherein the cover member holds the actuation element within the cavity.

Other aspects of the disclosure include a method for manufacturing a force sensor. The method can include etching a stack of bonded silicon wafers to form a sense die having a cavity and a diaphragm; placing an actuation element into the cavity such that the actuation element contacts a top side of the diaphragm; and bonding or growing a cover member on the top side of the sense die, wherein the cover member has an opening through which the actuation element extends, and wherein the cover member holds the actuation element within the cavity. A sense die assembly comprising the sense die, the actuation element, and the cover member can be flip chip bonded to a substrate, or vice versa.

Other aspects of the disclosure include a method for operating a force sensor, including one or more of applying a current to one or more sensing elements, receiving an external force against an actuation element which is retained in a sense die assembly having wafer level retention provided by a sense die and a cover member, transmitting the force from the actuation element to a diaphragm of a sense die, deflecting the diaphragm in response to the transmitted force, and outputting an electrical signal from the one or more sensing elements.

BRIEF DESCRIPTION OF THE DRAWINGS

The detailed description will reference the drawings briefly described below, wherein like reference numerals represent like parts.

DETAILED DESCRIPTION

It should be understood at the outset that although illustrative implementations of one or more aspects are illustrated below, the disclosed assemblies, systems, and methods may be implemented using any number of techniques, whether currently known or not yet in existence. The disclosure should in no way be limited to the illustrative implementations, drawings, and techniques illustrated below, but may be modified within the scope of the appended claims along with their full scope of equivalents. While values for dimensions of various elements are disclosed, the drawings may not be to scale.

Disclosed herein are force sensors which include a sense die assembly and methods for manufacturing the sense die assembly and the force sensor. The disclosed assembly, sensor, and methods utilize wafer-level retention to hold an actuation element in a cavity of the sense die. Thus, the force sensor is only slightly larger than the sense die itself, and the force sensor is useful in applications in which 25 mm$^2$ or less of a footprint area is available for a force sensor.

Figure 1:
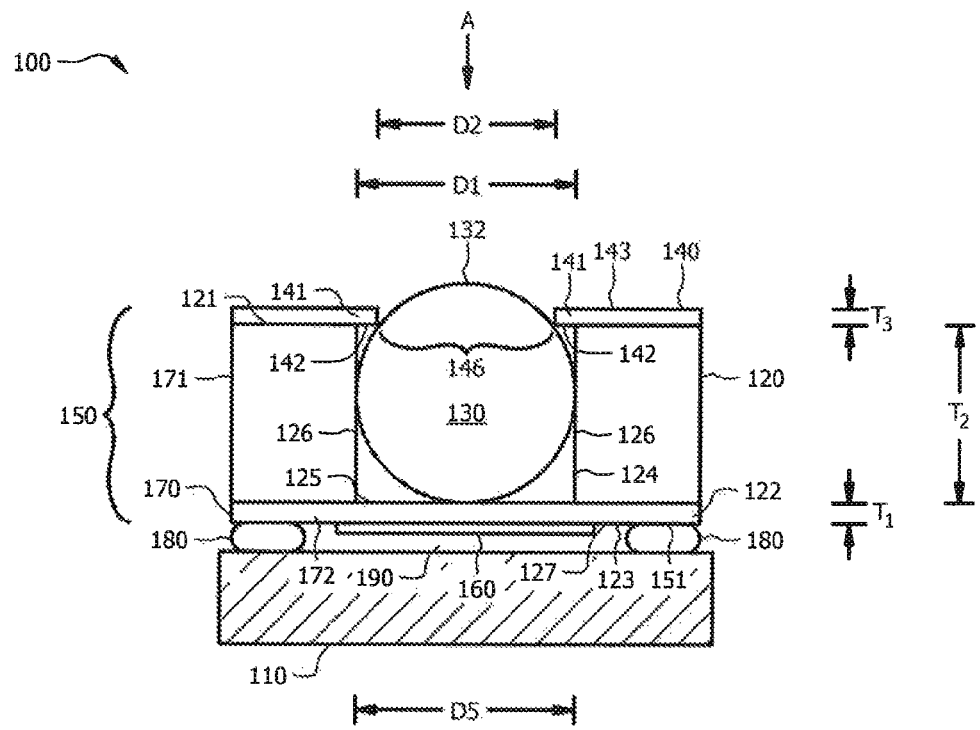
FIG. 1 is a schematic cross-sectional view of a force sensor according to the present disclosure and having a spherical actuation element.
Figure 2:
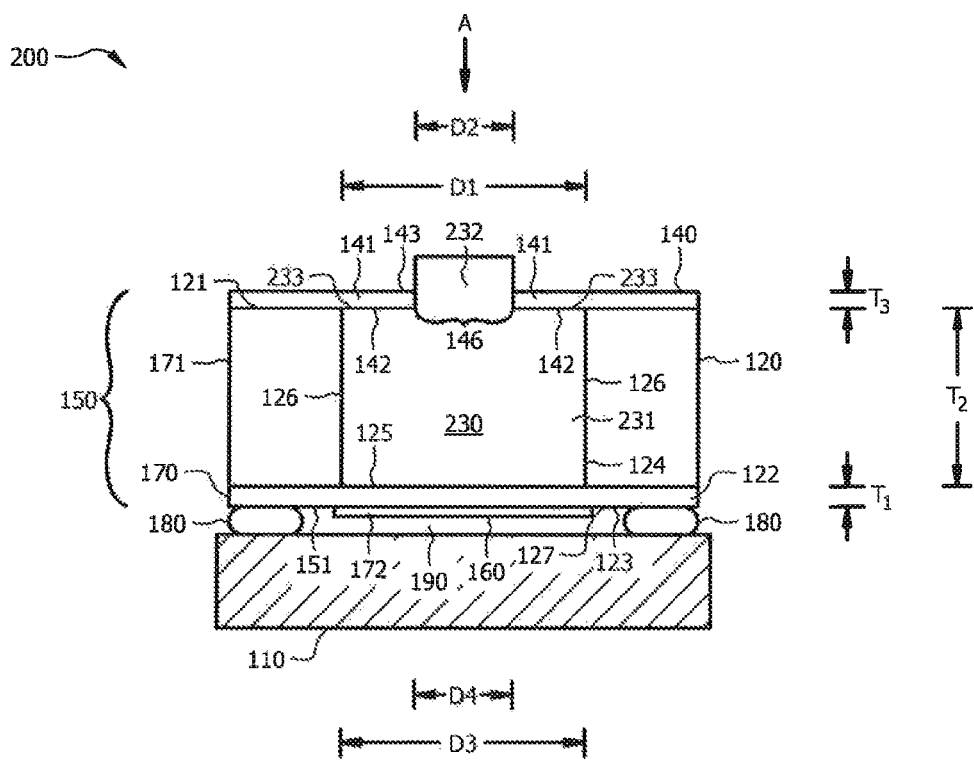
FIG. 2 is a schematic cross-sectional view of a force sensor according to the present disclosure and having a cylindrical actuation element.

A cross-sectional view of force sensors 100 and 200 is shown in FIG. 1 and FIG. 2. As shown in FIG. 1 and FIG. 2, the force sensors 100 and 200 may each include a substrate 110, a sense die 120 having a cavity 124 formed therein and a diaphragm 122 connected to the substrate 110, an actuation element 130 or 230 placed in the cavity 124 of the sense die 120, and a cover member 140. One or more sensing elements 160 can be positioned on a bottom side 127 of the diaphragm 122 of the sense die 120.

The sense die 120, the actuation element 130 or 230, and the cover member 140 can be collectively referred to as the sense die assembly 150 of the force sensor 100 or 200.

The sense die 120 can have a top side 121 and a bottom side 123. Reference to bottom side 123 and top side 121 of the sense die 120 is for clarity of reference to the illustrations in the figures, and it is not intended that the top side 121 of the sense die 120 always faces upward, nor is it intended that the bottom side 123 always faces downward. For example, in some cases during manufacture of the sense die 120, various etching techniques may be performed by referring to the top side 121 as the "back side" of the sense die 120 and by referring to the bottom side 123 as the "front side" of the sense die 120.

The sense die 120 can be formed from a stack of bonded silicon wafers, which in FIG. 1 and FIG. 2 is a stack of two wafers 170 and 171 bonded together. As can be seen in FIG. 1 and FIG. 2, wafer 171 can be stacked on top of the wafer 170. The cavity 124 (discussed in more detail below) is etched in the sense die 120 such that wafer 170 has a portion 172 which can act as the diaphragm 122 of the sense die 120. The portion 172 of the wafer 170 which can act as the diaphragm 122 can be where the sensing elements 160 are placed/formed on the diaphragm 122.

The wafer 170 can have a thickness T1 which is less than a thickness T2 of wafer 171. The cover member 140 likewise can have a thickness T3 which is less than a thickness T2 of the wafer 171. The thickness T1 of wafer 170 can be of a value sufficient for wafer 170 to function as a diaphragm 122 of the sense die 120 (e.g., equal to or less than 1 mm, 0.9 mm, 0.8 mm, 0.7 mm, 0.6 mm, 0.5 mm, 0.4 mm, 0.3 mm, 0.2 mm, or 0.1 mm). The thickness T2 of wafer 171 can be of a value sufficient for etching a cavity 124 which can receive the actuation element 130 or 230 (e.g., equal to or less than 5 mm, 4 mm, 3 mm, 2 mm, 1 mm, 0.9 mm, 0.8 mm, 0.7 mm, 0.6 mm, 0.5 mm, 0.4 mm, 0.3 mm, 0.2 mm, or 0.1 mm). The thickness T3 of the cover member 140 can be of a value sufficient to provide rigidity for retention of the actuation element 130 or 230 in the cavity 124 (e.g., equal to or less than 3 mm, 2 mm, 1 mm, 0.9 mm, 0.8 mm, 0.7 mm, 0.6 mm, 0.5 mm, 0.4 mm, 0.3 mm, 0.2 mm, or 0.1 mm).

While the sense die 120 is shown in FIG. 1 and FIG. 2 as formed from a stack of two bonded silicon wafers 170 and 171, it is contemplated that sense die 120 can be formed of a single wafer or more than two bonded wafers. The cavity 124 and diaphragm 122 can be suitably formed in the sense die 120 via etching or grinding the wafer or stack of wafers to get the diaphragm thickness desired (e.g., about ~100 microns or smaller). In such configuration, a cavity 124 would be formed such that the cavity 124 has a depth and the diaphragm 122 has a thickness of suitable values as disclosed herein.

Due to the wafer-level retention feature for the actuation element 130 or 230 (as disclosed in more detail below), the sense die 120 can have a footprint area (as viewed in a direction of arrow A) in a range of about 2.5 mm$^2$ (e.g., about 1.6 mm×1.6 mm) to about 25 mm$^2$ (e.g., about 5 mm×5 mm); alternatively, in a range of about 4 mm$^2$ (about 2 mm×2 mm) to about 25 mm$^2$ (about 5 mm×5 mm).

The sense die 120 can be made of any suitable material(s), for example, silicon.

The cavity 124 of the sense die 120 is formed by etching and is defined by the top side 125 of the diaphragm 122, one or more walls 126 (e.g., which are residual portions of silicon wafer 171 after etching is performed), and a portion 141 of the cover member 140 which defines a top wall 142 of the cavity 124. The cavity 124 can have a width of about 0.1 mm. Additionally, the cavity 124 can have a depth or thickness T2 of a value suitable for receiving the actuation element 130 or 230. The cavity 124 can be cylindrical in shape, cuboid in shape, or can have any other shape suitable for receiving the actuation element 130 or 230. FIG. 1 and FIG. 2 show the cavity 124 can have a cylindrical shape. The diameter D1 of the cavity 124 can be large enough to receive the actuation element 130 or 230 therein (e.g., equal to or less than 3 mm, 2 mm, 1 mm, 0.9 mm, 0.8 mm, 0.7 mm, 0.6 mm, 0.5 mm, 0.4 mm, 0.3 mm, 0.2 mm, or 0.1 mm). Also, FIG. 1 and FIG. 2 show the cavity 124 which can be formed by deep reactive ion etching (DRIE).

The diaphragm 122 of the sense die 120 has a top side 125 and a bottom side 127. The diaphragm 122 can be formed in the sense die 120 by etching techniques known in the art and/or disclosed herein (e.g., deep reactive ion etching) or grinding techniques known in the art and/or disclosed herein. Reference to top side 125 and bottom side 127 of the diaphragm 122 is for clarity of reference to the illustrations in the figures, and it is not intended that the top side 125 of the diaphragm 122 always faces upward, nor is it intended that the bottom side 127 of the diaphragm 122 always faces downward. However, reference to the top side 125 of the diaphragm 122 and the top side 121 of the sense die 120 is intended to reference orientation of top side 125 and top side 121 in the same direction, and likewise, reference to the bottom side 127 of the diaphragm 122 and the bottom side 123 of the sense die 120 is intended to reference orientation of bottom side 123 and bottom side 127 in the same direction.

The diaphragm 122 can have a thickness T1 sufficient for use in force sensors. Additionally or alternatively, the thickness T1 of the diaphragm 122 can be of a value such that the diaphragm 122 can deflect in response to a force applied to the actuation element 130 or 230 in the direction of arrow A. As discussed in more detail below, the sensing element(s) 160 can be formed/placed on the bottom side 127 of the diaphragm 122.

The diaphragm 122 can be fabricated by back-side etching a silicon die (e.g., made of a single silicon wafer or a stack of bonded silicon wafers 170 and 171 as discussed herein) with an etching technique disclosed herein. For example, the diaphragm 122 can be the portion of the silicon wafer(s) which is remaining after deep reactive ion etching (DRIE) of the cavity 124 in the sense die 120.

The sense die 120 can have one or more sensing elements 160 located on a bottom side 127 of the diaphragm 122. The sensing elements 160 can be one or more piezoresistive elements or components and/or other circuitry (e.g., trim circuitry, signal conditioning circuitry, etc.) formed using suitable fabrication or printing techniques.

The sensing elements 160 (e.g., piezoresistive elements) can be configured to have an electrical resistance that varies according to an applied mechanical force (e.g., deflection of the diaphragm 122) in the direction of arrow A. In some cases, the sensing elements 160 can be formed of a silicon piezoresistive material. Alternatively, the sensing elements 160 can be any other suitable sensing elements formed of any suitable material, silicon or non-silicon based. Sensing elements 160 in the form of piezoresistive elements can be connected in a Wheatstone bridge configuration (e.g., a full or half bridge configuration).

The one or more sensing elements 160 can sense a deflection of the diaphragm 122 in response to an applied force in the direction of arrow A.

The cover member 140 can be positioned on the top side 121 of the sense die 120. The cover member 140 can have an opening 146 positioned over at least a portion of the cavity 124 of the sense die 120 and through which the actuation element 130 or 230 extends. The opening 146 can be defined by the portion 141 of the cover member 140 which extends over another portion of the cavity 124. The portion 141 of the cover member 140 (and thus the opening 146), as viewed in the direction of arrow A, may have any shape configured to hold the actuation element 130 or 230 within the cavity 124 of the sense die 120 while allowing a portion 132 or 232 of the actuation element 130 or 230 to extend past the top side 143 of the cover member 140. For example, the portion 141 and opening 146 can have a circular shape, a rectangular shape, a square shape, an oval shape, a triangular shape, a pentagonal shape, a hexagonal shape, and so on. A diameter D2 of the opening 146 is generally less than the diameter D1 of the cavity 124.

The cover member 140 can hold the actuation element 130 or 230 within the cavity 124 of the sense die 120 and can provide wafer-level retention of the actuation element 130 or 230 in the sense die assembly 150. That is, a portion 141 of the cover member 140 may define a top wall 142 of the cavity 124 for retaining the actuation element 130 or 230. In some cases, the opening 146 may be precisely formed with respect to the dimensions of the actuation element 130 or 230 (e.g., the dimensions of the ball bearing in FIG. 1 or the cylindrical pin in FIG. 2) so as to maintain a relatively constant point of contact between the actuation element 130 or 230 and the sensing diaphragm 122.

As illustrated in FIG. 1 and FIG. 2, the cover member 140 is disposed on the top side 121 of the sense die 120. The cover member 140 is not attached directly to the substrate 110. The cover member 140 can be placed on the sense die 120 in any manner, for example, by 1) bonding or 2) crystal growth. The cover member 140 in the form of a silicon, glass, metal, ceramic, or plastic wafer may be attached or connected to the top side 121 of the sense die 120 through bonding. The bonding or connection of the cover member 140 to the sense die 120 may be achieved by using a suitable adhesive or any other suitable bonding mechanism (e.g., glass frit, solder, eutectic, fusion bonding, anodic bonding, etc.). In an aspect, the cover member 140 may be of a material substantially the same as the sense die 120; alternatively, a different material. Alternatively to being a bonded wafer, the cover member 140 may be formed as a layer of silicon or silicon oxide on the top side 121 of the sense die 120 by growing crystals of silicon or silicon oxide through standard lithography growth patterns. Alternatively, the cover member 140 may be formed from a B-stage epoxy which is deposited on the top side 121 of the sense die 120.

While the opening 146 of the cover member 140 is shown in FIG. 1 and FIG. 2 as centered over the cavity 124, it is contemplated that the opening 146 may be positioned off-center with respect to the cavity 124 or at any location such that at least a portion of the opening 146 facilitates the extension of the actuation element 130 or 230 therethrough for transmitting a force to the diaphragm 122 such that the sensing elements 160 generate electrical signals.

FIG. 1 and FIG. 2 show the force sensor 100 and 200 can include an actuation element 130 for transmitting an external force to the sense die 120. The actuation element 130 can be placed in the cavity 124 of the sense die 120 and in contact with i) a top side 125 of the diaphragm 122, ii) wall 126 of the cavity 124, and iii) a top wall 142 of the cavity 124 defined by the portion 141 of the cover member 140 which is positioned over a portion of the cavity 124.

The actuation element 130 in FIG. 1 is in the form of a ball bearing. The actuation element 130 can be received by the top side 125 of the diaphragm 122 and the wall 126 of the cavity 124. The diameter D5 of the actuation element 130 can be slightly smaller than the diameter D1 of the cavity 124 (e.g., slightly smaller than 3 mm, 2 mm, 1 mm, 0.9 mm, 0.8 mm, 0.7 mm, 0.6 mm, 0.5 mm, 0.4 mm, 0.3 mm, 0.2 mm, or 0.1 mm). For example, the diameter D5 of the actuation element 130 can be 0.1 mm.

The actuation element 230 in FIG. 2 is in the form of a cylindrical pin having a cylindrical shape. The cylindrical pin can include a first portion 231 and a second portion 232. The first portion 231 has a diameter D3 which can be equal to or less than 3 mm, 2 mm, 1 mm, 0.9 mm, 0.8 mm, 0.7 mm, 0.6 mm, 0.5 mm, 0.4 mm, 0.3 mm, 0.2 mm, or 0.1 mm. The diameter D3 can be larger than a diameter D4 of the second portion 232. The diameter D3 of the first portion 231 can also be larger than the opening 146 in the cover member 140 through which the second portion 232 of the actuation element 230 (the cylindrical pin) extends. The diameter D3 of the first portion 231 can be slightly smaller than the diameter D1 of the cavity 124, and the diameter D4 of the second portion 232 can be slightly smaller than the diameter D2 of the opening 146. Because the diameter D3 of the first portion 231 is larger than the diameter D4 of the second portion 232, the cylindrical pin has a lip 233 which abuts the top wall 142 of the cavity 124 (which is defined by the portion 141 of the cover member 140). Contact of the lip 233 with the top wall 142 retains the actuation element 230 in the cavity 124.

The actuation element 130 or 230 can generally extend from the top side 125 of the diaphragm 122 to the top wall 142 formed by the cover member 140. The actuation element 130 or 230 can be positioned (and the cavity 124 can be formed) at any position on the sense die 120. For example, actuation element 130 or 230 and the cavity 124 can be substantially centered relative to the sensing elements 160 or may be positioned at any other location on the diaphragm 122 relative to the sensing elements 160.

In manufacturing of the force sensor 100 or 200, the actuation element 130 or 230 can be placed in the cavity of the sense die 120 before placing the cover member 140 on the sense die 120.

The substrate 110 can be any surface to which the sense die assembly 150 can be mounted. The substrate 110 may include ceramic material (e.g., alumina), which may have similar temperature expansion coefficients. Alternatively, the substrate 110 can include any other suitable materials (e.g., a printed circuit board (PCB)).

The bottom side 123 of the sense die 120 (and the bottom side 127 of the diaphragm 122) can be flip chip mounted to the substrate 110 via electrically conductive bonds 180. For example, the sense die 120 can be electrically connected to the substrate 110 via ball bump bonds which electrically connect bond pads (not shown) of the sense die 120 (i.e., on the bottom side 127 of the diaphragm 122) to bond pads (not shown) on the substrate 110.

Alternatively or additionally, the sense die 120 can be electrically connected to the substrate 110 using any suitable connecting mechanism (e.g., adhesive, ball-grid array (BGA), solder, lead wires, or a combination thereof). For example, adhesive can be used as the material for one or more of the electrically conductive bonds 180. Any suitable conductive adhesive can be used. A nonlimiting example of a conductive adhesive is SDC5000, which is available from Momentive Performance Materials Inc. of Waterford, N.Y. It is contemplated that any other suitable conductive adhesive can be used. In some aspects, the conductive adhesive can be used in combination with a nonconductive adhesive. A nonlimiting example of a nonconductive adhesive is RTV6424, which is available from Momentive Performance Materials Inc. of Waterford, N.Y. When using an adhesive, the adhesive can be provided in a pattern to electrically connect bond pads (not shown) of the sense die 120 (i.e., on the bottom side 127 of the diaphragm 122) to bond pads (not shown) on the substrate 110. In another example, wire bonds can electrically connect the substrate 110 to the sense die assembly 150. The one or more wire bonds can include any electrically conductive metal, such as copper; however, any suitable material may be used, such as conductive polymers.

A chamber or space 190 can be present between the bottom side 123 of the sense die 120 (the bottom side 127 of the diaphragm 122) and the substrate 110. The chamber or space 190 allows the diaphragm 122 to deflect in the direction of arrow A (e.g., in response to an applied force transmitted by the actuation element 130 or 230) without contacting or bottoming out against the substrate 110. The chamber or space 190 also provides room for the sensing elements 160 which can be located on the bottom side 123 of the sense die 120. The chamber or space 190 can also isolate the sensing elements 160 from the source of the force.

In operation, when a current is applied to the piezoresistive sensing elements 160 (e.g., a Wheatstone bridge configuration of the piezoresistive elements), an electrical output signal may be generated that is related to the degree of deflection of the diaphragm 122 in the direction of arrow A, and thus the force applied to the actuation element 130 or 230 in the direction of arrow A. The actuation element 130 or 230 may be configured to transmit the external force to the diaphragm 122, which then deflects the diaphragm 122 accordingly and changes the resistance of the piezoresistive elements 160. In some instances, the point of contact between the diaphragm 122 and actuation element 130 or 230 can determine to some extent the amount of electrical signal outputted, with differing points of contact producing different output signals for the same applied force.

Thus, a method for operating the force sensor 100 or 200 can include one or more of i) applying a current to one or more sensing elements 160, ii) receiving an external force against an actuation element 130 or 230 which is retained in a sense die assembly 150 having wafer level retention provided by a sense die 120 and a cover member 140, iii) transmitting the force from the actuation element 130 to 230 to a diaphragm 122 of a sense die 120, iv) deflecting the diaphragm 122 in response to the transmitted force, and v) outputting an electrical signal from the one or more sensing elements 160.

Embodiments of a method of manufacturing the force sensor 100 or 200 are also disclosed herein. The method can include etching (e.g. via deep reactive ion etching) a stack of bonded silicon wafers 170 and 171 to form a sense die 120 having the cavity 124 and a diaphragm 122, placing an actuation element 130 or 230 into the cavity 124 such that the actuation element 130 or 230 contacts a top side 125 of the diaphragm 122; and bonding or growing a cover member 140 on the top side 121 of the sense die 120, wherein the cover member 140 can have an opening 146 through which a portion 132 or 232 of the actuation element 130 or 230 extends, and wherein the cover member 140 can hold the actuation element 130 or 230 within the cavity 124.

The method can also include ball bumping a bottom side 151 of the sense die assembly 150 comprising the sense die 120, the actuation element 130 or 230, and the cover member 140; sawing the sense die assembly 150 from the stack of bonded silicon wafers 170 and 171; and flip chip bonding the bottom side 151 of the sense die assembly 150 onto a substrate 110.

Alternatively, the method can also include flip chip bonding the substrate 110 to the bottom side 151 of the sense die assembly 150 (comprising the sense die 120, the actuation element 130 or 230, and the cover member 140); sawing the sense die assembly 150 from the stack of bonded silicon wafers 170 and 171; and placing the sawn sense die assembly 150 (which is flip chip bonded to the substrate 110) on nitto tape. Placing the sense die assembly 150 on nitto tape allows delivery of the sense die assembly 150 to a customer in wafer form.

Once assembled, the actuation element 130 or 230 can engage and transmit an external force to the diaphragm 122, which in turn deflects and causes the sensing elements 160 to provide electrical signals which vary with the magnitude of the external force.

Alternative methods disclosed herein can include use of a single silicon wafer instead of a stack of silicon wafers 170 and 171, or a stack of silicon wafers which includes more than two wafers.

The disclosed force sensor 100 and 200, sense die assembly 150, and the associated alternative configurations provide a sense die assembly 150 which uses the cover member 140 formed of silicon or silicon oxide to provide wafer-level retention of the actuation element 130 or 230 in the cavity 124 of a sense die 120, instead of a protective cover or housing which is formed of plastic, polyamide, ceramic, or metal and which is connected directly to the substrate 110. By restricting the movement of the actuation element 130 or 230 within the cavity 124 formed by the diaphragm 122, wall(s) 126, and the cover member 140, miniaturization of the force sensors 100 and 200 and the sense die assembly 150 to a footprint of less than about 25 mm$^2$ (e.g., less than about 5 mm×5 mm) can be achieved. That is, using the cover member 140 to provide wafer-level retention of the actuation element 130 or 230 in the cavity 124 of the sense die 120, instead of a protective cover or housing, allows for miniaturization of the force sensors 100 and 200 to a footprint area of less than about 25 mm$^2$ (e.g., less than about 5 mm×5 mm).

The applications for the force sensor 100 or 200 and sense die assembly 150 disclosed herein are not to be limited to a particular application. Instead, the disclosed configurations can provide a low cost force sensor solution for applications which require a footprint area of less than about 25 mm$^2$ (e.g., less than about 5 mm×5 mm).

ADDITIONAL DESCRIPTION

Aspect 1. A force sensor comprising a substrate; a sense die having a top side and a bottom side, wherein the sense die includes a cavity formed therein and a diaphragm, and one or more sensing elements positioned on a bottom side of the diaphragm, wherein the bottom side of the sense die is flip chip bonded to the substrate; an actuation element placed in the cavity of the sense die and in contact with a top side of the diaphragm and with a wall of the cavity; and a cover member positioned on the top side of the sense die, wherein the cover member includes an opening positioned over the cavity of the sense die, wherein the actuation element extends through the opening, wherein the cover member holds the actuation element within the cavity.

Aspect 2. The force sensor of Aspect 1, wherein the actuation element is spherical in shape.

Aspect 3. The force sensor of Aspect 1, wherein the actuation element is cylindrical in shape and has a first portion and a second portion, wherein the first portion has a diameter larger than a diameter of the second portion, wherein the diameter of the first portion is larger than the opening in the cover member through which the second portion of the actuation element extends.

Aspect 4. The force sensor of any of Aspects 1 to 3, wherein the cover member is a silicon or silicon oxide layer grown on the top side of the sense die using standard lithography growth patterns; alternatively, an epoxy deposited on the top side of the sense die.

Aspect 5. The force sensor of any of Aspects 1 to 4, wherein the cover member is formed from a wafer made of silicon, glass, metal, ceramic, or plastic.

Aspect 6. The force sensor of any of Aspects 1 to 5, wherein the sense die has a footprint area in a range of about 2.5 mm$^2$ to about 25 mm$^2$.

Aspect 7. The force sensor of any of Aspects 1 to 6, wherein the cavity has a width of about 0.1 mm.

Aspect 8. The force sensor of any of Aspects 1 to 7, wherein the one or more sensing elements comprises one or more piezoresistive elements located on the bottom side of the diaphragm.

Aspect 9. The force sensor of any of Aspects 1 to 8, wherein a chamber or a space is present between the bottom side of the diaphragm and the substrate.

Aspect 10. The force sensor of any of Aspects 1 to 9, wherein the cavity is cylindrical or cuboid in shape.

Aspect 11. A sense die assembly comprising a sense die having a top side and a bottom side, wherein the sense die includes a cavity and a diaphragm formed therein by etching, and one or more sensing elements positioned on a bottom side of the diaphragm; an actuation element placed in the cavity of the sense die and in contact with a top side of the diaphragm and with a wall of the cavity; and a cover member positioned on the top side of the sense die, wherein the cover member includes an opening positioned over the cavity of the sense die, wherein a portion of the actuation element extends through the opening, wherein the cover member provides wafer-level retention of the actuation element in the cavity.

Aspect 12. The sense die assembly of Aspect 11, wherein the cover member is a silicon or silicon oxide layer grown on the top side of the sense die using standard lithography growth patterns; alternatively, an epoxy deposited on the top side of the sense die.

Aspect 13. The sense die assembly of Aspect 11, wherein the cover member is formed from a wafer made of silicon, glass, metal, ceramic, or plastic.

Aspect 14. The sense die assembly of any of Aspects 11 to 13, wherein the cavity has a width of about 0.1 mm.

Aspect 15. The sense die assembly of any of Aspects 11 to 14, wherein the one or more sensing elements comprises one or more piezoresistive elements located on the bottom side of the diaphragm.

Aspect 16. The sense die assembly of any of Aspects 11 to 15, wherein the cavity is cylindrical or cuboid in shape.

Aspect 17. The sense die assembly of any of Aspects 11 to 16, wherein the bottom side of the sense die is flip chip bonded to a substrate.

Aspect 18. The sense die assembly of any of Aspects 11 to 17, wherein the actuation element is spherical in shape.

Aspect 19. The sense die assembly of any of Aspects 11 to 17, wherein the actuation element is cylindrical in shape and has a first portion and a second portion, wherein the first portion has a diameter larger than a diameter of the second portion, wherein the diameter of the first portion is larger than the opening in the cover member through which the second portion of the actuation element extends.

Aspect 20. The sense die assembly of any of Aspects 11 to 19, wherein the sense die has a footprint area in a range of about 2.5 mm$^2$ to about 25 mm$^2$.

Aspect 21. The sense die assembly of any of Aspects 11 to 20, wherein a chamber or a space is present between the bottom side of the diaphragm and the substrate.

Aspect 22. A method of manufacturing a force sensor comprising etching a stack of bonded silicon wafers to form a sense die having a cavity and a diaphragm; placing an actuation element into the cavity such that the actuation element contacts a top side of the diaphragm; and bonding or growing a cover member on a top side of the sense die, wherein the cover member has an opening through which the actuation element extends, and wherein the cover member holds the actuation element within the cavity.

Aspect 23. The method of Aspect 22, further comprising ball bumping a bottom side of a sense die assembly comprising the sense die, the actuation element, and the cover member; sawing the sense die assembly from the stack of bonded silicon wafers; and flip chip bonding the bottom side of the sense die assembly onto a substrate.

Aspect 24. The method of Aspect 22, further comprising flip chip bonding a substrate to a bottom side of a sense die assembly comprising the sense die, the actuation element, and the cover member, sawing the sense die assembly from the stack of bonded silicon wafers; and placing the sense die assembly on nitto tape.

Aspect 25. The method of any of Aspects 22 to 24, wherein one or more piezoresistive elements are located on a bottom side of the diaphragm.

Aspect 26. The method of any of Aspects 22 to 25, wherein the actuation element is spherical in shape.

Aspect 27. The method of any of Aspects 22 to 25, wherein the actuation element is cylindrical in shape and has a first portion and a second portion, wherein the first portion has a diameter larger than a diameter of the second portion, wherein the diameter of the first portion is larger than the opening in the cover member through which the second portion of the actuation element extends.

Aspect 28. The method of any of Aspects 22 to 27, wherein the cover member is a silicon or silicon oxide layer grown on the top side of the sense die using standard lithography growth patterns; alternatively, an epoxy deposited on the top side of the sense die.

Aspect 29. The method of any of Aspects 22 to 27, wherein the cover member is formed from a wafer made of silicon, glass, metal, ceramic, or plastic.

Aspect 30. The method of any of Aspects 22 to 29, wherein the sense die has a footprint area in a range of about 2.5 mm$^2$ to about 25 mm$^2$.

Aspect 31. The method of any of Aspects 22 to 30, wherein the cavity has a width of about 0.1 mm.

Aspect 32. The method of any of Aspects 23 to 31, wherein a chamber or a space is present between a bottom side of the diaphragm and the substrate.

Aspect 33. The method of any of Aspects 22 to 32, wherein the cavity is cylindrical or cuboid in shape.

While several embodiments have been provided in the present disclosure, it should be understood that the disclosed systems and methods may be embodied in many other specific forms without departing from the spirit or scope of the present disclosure. The present examples are to be considered as illustrative and not restrictive, and the intention is not to be limited to the details given herein. For example, the various elements or components may be combined or integrated in another system, or certain features may be omitted or not implemented.

Also, techniques, systems, subsystems, and methods described and illustrated in the various embodiments as discrete or separate may be combined or integrated with other systems, modules, techniques, or methods without departing from the scope of the present disclosure. Other items shown or discussed as directly coupled or communicating with each other may be indirectly coupled or communicating through some interface, device, or intermediate component, whether electrically, mechanically, or otherwise. Other examples of changes, substitutions, and alterations are ascertainable by one skilled in the art and could be made without departing from the spirit and scope disclosed herein.

What is claimed is:

1. A force sensor comprising:
    a substrate;
    a sense die having a top side and a bottom side, wherein the sense die includes a cavity formed therein and a diaphragm, and one or more sensing elements positioned on a bottom side of the diaphragm, wherein the bottom side of the sense die is flip chip bonded to the substrate;
    an actuation element placed in the cavity of the sense die and in contact with a top side of the diaphragm and with a wall of the cavity; and
    a cover member positioned on the top side of the sense die, wherein the cover member includes an opening positioned over the cavity of the sense die, wherein the actuation element extends through the opening, wherein the cover member holds the actuation element within the cavity.

2. The force sensor of claim 1, wherein the actuation element is spherical in shape.

3. The force sensor of claim 1, wherein the actuation element is cylindrical in shape and has a first portion and a second portion, wherein the first portion has a diameter larger than a diameter of the second portion, wherein the diameter of the first portion is larger than the opening in the cover member through which the second portion of the actuation element extends.

4. The force sensor of claim 1, wherein the cover member is a silicon or silicon oxide layer grown on the top side of the sense die using standard lithography growth patterns.

5. The force sensor of claim 1, wherein the cover member is formed from a wafer made of silicon, glass, metal, ceramic, or plastic.

6. The force sensor of claim 1, wherein the sense die has a footprint area in a range of about 2.5 $mm^2$ to about 25 $mm^2$.

7. The force sensor of claim 1, wherein the cavity has a width of about 0.1 mm.

8. The force sensor of claim 1, wherein the one or more sensing elements comprises one or more piezoresistive elements located on the bottom side of the diaphragm.

9. The force sensor of claim 1, wherein a chamber or a space is present between the bottom side of the diaphragm and the substrate.

10. The force sensor of claim 1, wherein the cavity is cylindrical or cuboid in shape.

11. A sense die assembly comprising:
    a sense die having a top side and a bottom side, wherein the sense die includes a cavity and a diaphragm formed therein by etching, and one or more sensing elements positioned on a bottom side of the diaphragm;
    an actuation element placed in the cavity of the sense die and in contact with a top side of the diaphragm and with a wall of the cavity; and
    a cover member positioned on the top side of the sense die, wherein the cover member includes an opening positioned over the cavity of the sense die, wherein a portion of the actuation element extends through the opening,
    wherein the cover member provides wafer-level retention of the actuation element in the cavity.

12. The sense die assembly of claim 11, wherein the cover member is a silicon or silicon oxide layer grown on the top side of the sense die using standard lithography growth patterns.

13. The sense die assembly of claim 11, wherein the cover member is formed from a wafer made of silicon, glass, metal, ceramic, or plastic.

14. The sense die assembly of claim 11, wherein the cavity has a width of about 0.1 mm.

15. The sense die assembly of claim 11, wherein the one or more sensing elements comprises one or more piezoresistive elements located on the bottom side of the diaphragm.

16. The sense die assembly of claim 11, wherein the cavity is cylindrical or cuboid in shape.

* * * * *